United States Patent [19]
Loos et al.

[11] Patent Number: 5,487,018
[45] Date of Patent: Jan. 23, 1996

[54] ELECTRONIC DESIGN AUTOMATION APPARATUS AND METHOD UTILIZING A PHYSICAL INFORMATION DATABASE

[75] Inventors: Joann Loos, Palo Alto; Chao-Yuan Wang, Newark; Mossaddeg Mahmood, San Jose, all of Calif.

[73] Assignee: VLSI Technology, Inc., San Jose, Calif.

[21] Appl. No.: 106,104

[22] Filed: Aug. 13, 1993

[51] Int. Cl.[6] ................................................. G06F 17/50
[52] U.S. Cl. ...................... 364/489; 364/488; 364/490; 364/578
[58] Field of Search ................................. 364/488, 489, 364/490, 491, 578

[56] References Cited

U.S. PATENT DOCUMENTS

| | | | |
|---|---|---|---|
| 4,922,432 | 5/1990 | Kobayashi et al. | 364/490 |
| 4,967,367 | 10/1990 | Piednoir | 364/489 |
| 5,084,824 | 1/1992 | Lam et al. | 364/490 |
| 5,164,911 | 11/1992 | Juran et al. | 364/578 |
| 5,197,016 | 3/1993 | Sugimoto et al. | 364/490 |
| 5,222,030 | 6/1993 | Dangelo et al. | 364/489 |
| 5,278,769 | 1/1994 | Bair et al. | 364/490 |
| 5,311,443 | 5/1994 | Crain et al. | 364/491 |
| 5,359,537 | 10/1994 | Saucier et al. | 364/489 |
| 5,359,539 | 10/1994 | Matsumoto et al. | 364/489 |
| 5,367,468 | 11/1994 | Fukasawa et al. | 364/490 |

OTHER PUBLICATIONS

"Integrated VLSI CAD Systems at Digital Equipment Corporation" by A. F. Hutchings et al., IEEE, 1985, pp. 543–548.

"On The Integration of a CAD System for IC Design", by E. M. da Costa et al., European Conference on EDA, Mar. 1984, pp. 40–45.

"IDEAS—An Integrated Design Automation System", by Z. Mehmood et al., IEEE International Conference on Computer Design, Oct. 1987, pp. 407–412.

"Cell Libraries & Assembly Tools for Analog/Digital CMOS & BiCMOS Application–Specific Integrated Circuit Design," IEEE, vol. 24, No. 5, Oct. 1989, pp. 1419–1432.

"CAD Systems for IC Design", by M. E. Daniel et al., IEEE Transaction on Computer-Aided Design of Integrated Circuits and Systems, vol. CAD–1, No. 1, Jan. 1982, pp. 2–12.

Primary Examiner—Kevin J. Teska
Assistant Examiner—Russell W. Frejd
Attorney, Agent, or Firm—Flehr, Hohlback, Test, Albritton & Herbert

[57] ABSTRACT

A physical information database is utilized as an interface between a datapath cell library and a number of electronic design automation tools, such as a datapath synthesis tool, a chip estimator, an HDL generation tool, and a datapath compilation tool. The physical information database includes global parameters applicable to every cell in the datapath cell library and local parameters defining attributes that are associated with individual cells in the datapath cell library. The physical information database includes a standard format allowing uniform access by the electronic design automation tools.

20 Claims, 4 Drawing Sheets

ELECTRONIC DESIGN AUTOMATION APPARATUS AND METHOD UTILIZING A PHYSICAL INFORMATION DATABASE

BRIEF DESCRIPTION OF THE INVENTION

This invention relates generally to the automated design of complex circuits. This invention more particularly relates to an electronic design automation apparatus and method that utilizes a flexible physical information database to provide circuit performance information.

BACKGROUND OF THE INVENTION

Application Specific Integrated Circuits (ASICs) are designed using a variety of Computer Aided Design (CAD) tools. The development of ASICs with CAD tools is often referred to as Electronic Design Automation (EDA).

Known CAD tools include datapath synthesis tools, datapath compilation tools, chip estimation tools and HDL generation tools. A datapath synthesis tool processes a high-level characterization of a datapath circuit into a specific circuit. More particularly, a datapath synthesis tool synthesizes a specified circuit using a Hardware Description Language (HDL), such as Verilog or VHDL. The HDL characterization of the circuit provides a Register Transfer Level (RT-level) description of an ASIC and a set of design constraints. The datapath synthesis tool then tries to map the HDL circuit description, within the design constraints, into a netlist. A netlist is comprised of a list of circuit components and the interconnections between the components. The circuit components are obtained from a datapath cell library.

An HDL generation tool converts a schematic netlist into an HDL description of the circuit (which may include RAMs, ROMs, datapath cells and other standard circuit cells). The HDL description may then be used in simulation operations.

Another known CAD tool is a datapath compilation tool. A high-performance ASIC typically includes a datapath that computes the arithmetic and logic functions of the ASIC. The central processing unit (CPU) of a computer and the processing pan of a digital signal processor (DSP) are examples of datapaths. A datapath design is a network of datapath cells, such as multipliers, adders, ALUs, multiplexers and register-files. These cells have regular structures that are efficiently implemented in a bit-slice fashion. This bit-slice structure is obtained by "tiling" together a variety of "leaf cells". That is, a number of logical gates ("leaf cells") are grouped ("tiled") together to achieve a bit-slice structure.

Prior art datapath compilation tools rely upon bitwidth when calculating relevant power requirements, This technique is adequate for the simple non-parameterized datapath cells typically used in the past. However, the technique cannot model complex cells that are now available in datapath libraries. Thus, it would be desirable to provide a datapath compilation tool which enables more sophisticated power consumption calculations that are based upon such factors as frequency, activity rate, and voltage derating values.

Another problem with prior art datapath compilation tools is that physical information regarding the datapath is only available after a time-consuming and computationally expensive compiling operation. This approach yields physical information for a complete datapath design. It is frequently desirable to obtain physical information for datapath functions without relying upon a time-consuming and computationally expensive compilation of an entire datapath.

A chip estimator, also known as a chip estimation tool, is another tool that is used in an electronic design automation process. As suggested by its name, a chip estimator provides general information regarding such issues as how big a circuit will be, what its power dissipation will be, whether the design should be partitioned into two chips, the type of package to be used, and other issues considered during a feasibility assessment of a design.

The chip estimator can be commanded to generate estimates for each instance of a cell or to generate estimates for an entire chip. Each cell instance can hold parameters called attributes, such as the number of shifts for a barrel shifter or the word size for a multiplier. These parameters are used to make individual estimates associated with a chip design.

OBJECTS AND SUMMARY OF THE INVENTION

It is a general object of the invention to provide a physical information database that may be utilized by a number of design automation tools.

it is another object of the invention to provide a physical information database that is readily adaptable to a variety of fabrication technologies.

It is another object of the invention to provide a physical information database that provides area and timing estimates without requiring datapath compilation.

It is a related object of the invention to provide a physical information database that includes global values applicable to every cell in a library.

It is another object of the invention to provide a physical information database that includes local values defining attributes that are associated with individual cells in a library.

It is another object of the invention to provide a physical information database that is easy to generate, debug, and maintain.

It is another object of the invention to provide a physical information database that enhances the operation of a datapath synthesis tool by providing area and timing information to enable the datapath synthesis tool to select appropriate circuit elements.

It is another object of the invention to provide a physical information database that enhances the operation of a chip estimation tool by providing area and power information to enable the chip estimator to rapidly predict spatial and power consumption characteristics of a given design.

It is another object of the invention to provide a physical information database that enhances the operation of an HDL generation tool by providing timing information to enable the HDL generation tool to supplement an HDL description with timing data.

It is another object of the invention to provide back-annotated capacitance values into a layout model or netlist for enabling better simulation thereof.

It is still another object of the invention to provide a physical information database that enhances the operation of a datapath compilation tool by providing global physical information that is useful to the datapath compilation tool in its calculation of power rail sizes.

These and other objects are achieved by a physical information database that is utilized as an interface between a datapath cell library and a number of electronic design automation tools, such as a datapath synthesis tool, a chip estimation tool, an HDL generation tool, and a datapath compilation tool. The physical information database includes global parameters applicable to every cell in the datapath cell library and local parameters defining attributes that are associated with individual cells in the datapath cell library. The physical information database stores these parameters in a standard format allowing uniform access by the electronic design automation tools.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE PREFERRED EMBODIMENTS

Figure 1:
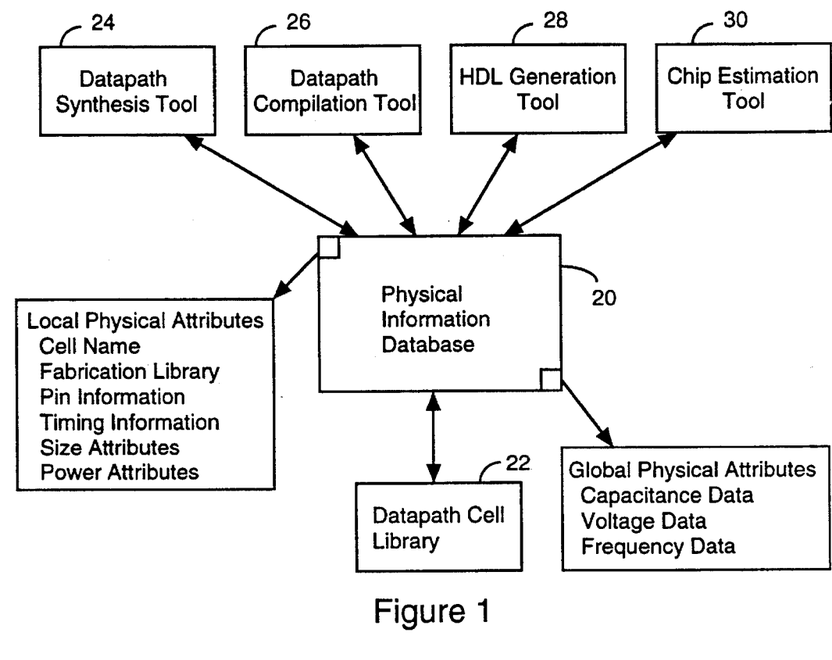
FIG. 1 is a conceptual depiction of the interaction of the elements utilized in accordance with the invention.

FIG. 1 depicts the conceptual relationship between the physical information database of the invention 20 and the various electronic design automation tools with which it interacts. The physical information database 20 serves as an interface between a datapath cell library 22 and an illustrative set of electronic design automation tools including a datapath synthesis tool 24, a datapath compilation tool 26, an HDL generation tool 28, and a chip estimation tool 30.

The physical information database 20 includes local physical attributes and global physical attributes. As illustrated in FIG. 1, the local physical attributes may be placed in a data structure that includes fields for such factors as a cell name, pin information, timing information, size attributes, and power attributes. Similarly, the global physical attributes may be placed in a data structure that includes fields for such factors as capacitance data, voltage data, and frequency data.

As will be described more fully herein, the local physical attributes may be used by any of the design automation tools (24, 26, 28, 30) in conjunction with a particular cell selected from the datapath cell library 22. Similarly, the design automation tools (24, 26, 28, 30) may access the global physical attributes within the physical information database 20.

Figure 2:
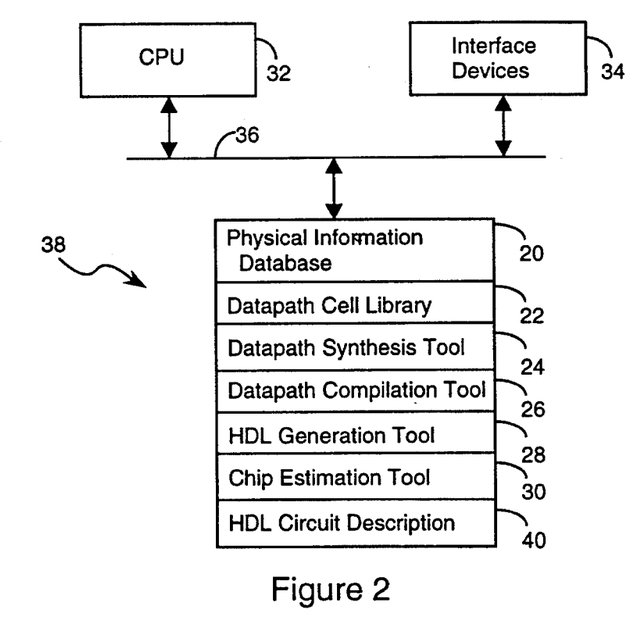
FIG. 2 is an illustration of the hardware elements associated with the present invention.

FIG. 2 depicts hardware elements embodying the elements associated with the invention. The invention operates in conjunction with a central processing unit (CPU) 32 which is coupled to a number of interface devices 34 through a bus 36. The interface devices constitute known computer input/output devices such as keyboards, mice, monitors, printers, etc. The CPU 32 executes a number of programs stored in memory unit 38, which may be any combination of disc, RAM, ROM, or other memory devices. With the present invention, the memory unit 38 stores the physical information database 20, the datapath cell library 22, the datapath synthesis tool 24, the datapath compilation tool 26, the HDL generation tool 28, the chip estimation tool 30, and an HDL circuit description 40. The operation of these elements in accordance with the invention will now be explained.

Figure 3:
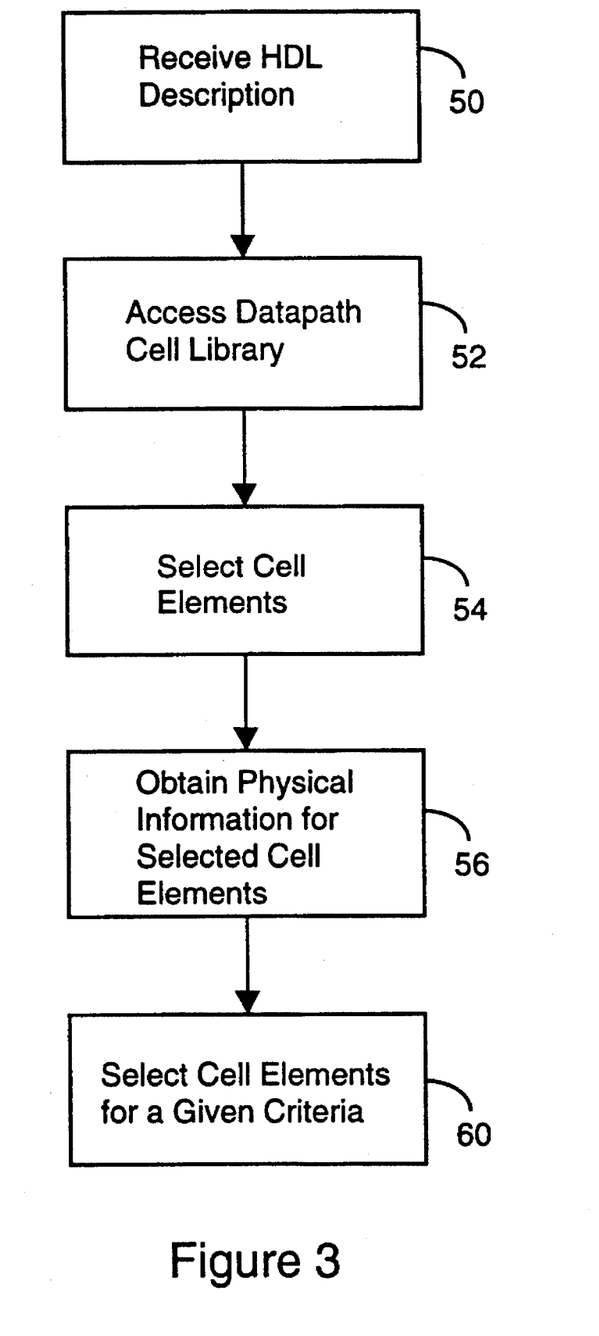
FIG. 3 is an illustration of the processing steps utilized when the physical information database of the invention is used in conjunction with a datapath synthesis tool.

Attention is initially directed to the operation of a datapath synthesis tool 24 in conjunction with the physical information database 20 of the invention. FIG. 3 depicts this process. The first step associated with the process of FIG. 3 is to receive a Hardware Description Language characterization of a given logical behavior (block 50). The following code represents an HDL (specifically, a VHDL) description of a given logical behavior:

```
(1)   entity asb_xor_xnor is
(2)   port(sel                  :in std _logic;
(3)         a,b,c,d             :in std_logic_vector(15 downto 0);
(4)         out1,out2           : out std_logic_vector(15 downto 0));
(5)   end asb_xor_xnor;
(6)   architecture module1 of asb_xor_xnor is
(7)   begin
(8)   process(sel,a,b,c,d)
(9)   variable asb_out : std_logic_vector(15 downto 0);
(10)        begin
(11)              if sel = '0' then
(12)                    asb_out := a + b;
(13)              else
(14)                    asb_out := a - b;
(15)              end if;
(16)        out1 <= asb_out xor d);
(17)        out2 <= xnor(asb_out,d);
(18)   end process;
(19)   end module1;
```

The first line of code defines the entity. In this example, the entity is called "asb_xor_xnor", indicating that addition or subtraction ("asb") is involved, an exclusive-OR operation ("xor") is involved, and an exclusive-NOR operation ("xnor") is involved. Lines 3–4 define the inputs and outputs of the entity. As specified at line 2, one input is a select line ("sel"). As defined at line 3, there are four input values ("a","b","c","d"); each input value is a 16 bit value (std_logic_vector (15 downto 0)). Line 4 identifies two 16 bit output values ("out1","out2"). Line 5 ends the entity description.

A description of the architecture for the entity begins at lines 6 and 7 of the code. Line 8 characterizes the inputs for the processing. A variable ("asb_out") is defined at line 9. A logical processing statement begins at line 10. Lines 11 and 12 establish that if the value for the select signal is "0", then the "a" and "b" input values are added. Otherwise, lines 13 and 14 provide that the "a" and "b" input values are subtracted. Line 15 terminates the "if" statement.

Line 16 defines the first output value ("out1") as an exclusive-OR operation between the two 16-bit values "asb_out" and "d". Line 17 defines the second output value ("out2") as an exclusive-XNOR operation between the two 16-bit values "asb_out" and "d". Line 19 terminates the architecture module1 of entity asb_xor_xnor.

Returning now to FIG. 3, the datapath synthesis tool 22 accesses (block 52) the datapath cell library 22 to select a number of elements (block 54) that can perform the specified logical functions constituting the given logical behavior defined in the HDL description. For instance, relying upon the foregoing example, it will be appreciated that a number of datapath cell library elements (or "instances" of such elements) are available to perform the specified addition and subtraction operations. For example, in the vcc4dp4 Datapath Library, a 0.8 micron CMOS datapath library commercially available from VLSI Technology, Inc., the assignee of the invention, a number of elements may be selected to perform the A+B operation. In particular, the following elements may be used to execute the A+B operation: a high-density adder (dpadd001h), a high-speed adder (dpadd001s), a high-density ALU (dpalu001h), a high-speed ALU (dpalu001s), a high-density adder/subtractor (dpasb001h), and a high-speed adder/subtractor (dpasb001s). Similarly, the following elements may be selected to perform the A−B operation: a high-density ALU (dpalu001h), a high-speed ALU (dpalu001s), a high-density adder/subtractor (dpasb001h), and a high-speed adder/subtractor (dpasb001s), a high-density subtractor (dpsub001h), and a high-speed subtractor (dpsub001s).

Thus, the cell selection step (block 54) will render a number of feasible cells that may be used to implement a logical behavior. The next step associated with the process of the invention is to obtain physical information corresponding to the selected cells (block 56). Based upon this physical information, a particular cell is selected for implementation (block 60).

The physical information database 20 of the invention includes information that may be used by a variety of EDA tools. In the example associated with FIG. 3, the physical information is used by the datapath synthesis tool 24 to select a cell. The physical information database 20 of the invention includes two types of data: global physical information and local physical information. The global physical information, which will be discussed below, defines attributes associated with the global operation of a given circuit implementation. The local physical information defines attributes associated with individual cells within a datapath cell library.

Each cell in the datapath cell library 22 has corresponding local physical information in the physical information database. One cell element selected in the foregoing example was a high-density adder/subtractor (dpasb001H). The following is a pseudocode representation of the internal data structure used to define the local physical information associated with this datapath cell:

```
(1) PMDNAME IS: dpasb001h
(2) For bitwidth: 16
(3) Cell tag is: vcc4dp2
(4) Now the pin info
(5)  pin         cap
(6)  A           0.06
(7)  B           0.06
(8)  INS_        0.03       (*Control Input*)
(9)  INST_CIN    0.11       (*Carry Input*)
(10) SO          0.06       (*Signal Out*)
(11) INS_COUT    0.05       (*Carry Output*)
(12) INST_OVR    0.03       (*Overflow Output*)
(13) Now the timing info
(14) from INS_L to SO
(15)             propRise   rampRise   propFall   rampFall
(16)             13.15      1.66       13.15      1.73
(17) from A to SO
(18)             propRise   rampRise   propFall   rampFall
(19)             15.03      1.66       15.03      1.73
(20) from B to SO
(21)             propRise   rampRise   propFall   rampFall
(22)             15.96      1.66       15.96      1.73
(23) from INST_CIN to SO
(24)             propRise   rampRise   propFall   rampFall
(25)             13.15      1.66       13.15      1.73
(26) from INST_to INST_COUT
(27)             propRise   rampRise   propFall   rampFall
(28)             12.05      7.41       13.15      0.86
(29) from A to INST_COUT
(30)             propRise   rampRise   propFall   rampFall
(31)             15.00      7.41       16.03      0.86
(32) from B to INST_COUT
(33)             propRise   rampRise   propFall   rampFall
(34)             15.00      7.41       16.96      0.86
(35) from INST_CIN to INS_COUT
(36)             propRise   rampRise   propFall   rampFall
(37)             10.5       7.41       10.5       0.86
(38) height is          646.4
(39) width is           75.5
(40) power is           62.4
(41) area is            48,803
(42) gate equivalents   168
```

The first line of code identifies the high-density adder/subtractor by its cell library name "DPASB001H". The second line of code indicates that this particular record is for a 16 bit embodiment of the adder/subtractor. The third line of code identifies the technology fabrication library as "vcc4dp2". As stated earlier, this designation corresponds to 0.8 micron CMOS datapath library available from VLSI Technology, Inc. In a preferred embodiment of the invention, the physical information database 20 will include a plurality of libraries corresponding to different fabrication technologies.

Lines 4–12 of the code define the capacitance values associated with each pin of the adder/subtractor element. Capacitance values are given in pico-Farads. Lines 13–37 define the propagation delays associated with each combination of input and output pins. Delay values are given in nanoseconds. The delay value for an element's output pin will depend upon the capacitive load associated with that output pin. The delay values for a circuit node are defined as:

$$\text{Rising\_delay} = \text{propRise} + (\text{rampRise} * \text{cap\_load})$$

and $$\text{Falling\_delay} = \text{propFall} + (\text{rampFall} * \text{cap\_load})$$

The capacitive load for a circuit node (or, equivalently, for a component's output pin) is the output capacitance of that pin plus the input capacitance of all pins connected to it.

Line 38 defines the height of the element in microns. Line 39 defines the width of the element in microns. Line 40 specifies the power consumption of the element in micro-Watts per megahertz. Line 41 defines the area of one bit-slice in micrometers squared. Finally, line 42 defines the "gate equivalents" value for the element. Each gate equivalent unit is equal to one 2-input NAND (4 transistors total).

It should be noted that the capacitance, delay and other parameter values used in this document are being presented only as examples of physical device characteristic values that would be stored in a typical implementation of the present invention. The actual physical device characteristic values stored in the physical information database will depend on the particular circuits in the relevant cell library and the manufacturing process used.

It will be appreciated by those skilled in the art that the information provided in the physical information database may be in any of a variety of forms and units. Generally, the information will be obtained from datasheets associated with a given datapath library or by automated library characterization tools. Thus, the particular format or syntax of the information is not important. The invention is directed toward the availability and utilization of this information, not its particular format. The format selected should merely represent a data structure that allows uniform access from a variety of EDA tools.

Returning to the HDL example previously discussed, another element for performing the A+B operation is a high-speed adder/subtractor (dpasb001s). The following is a pseudocode representation of the internal data structure used to define the local physical information associated with this datapath cell:

| | | |
|---|---|---|
| (1) PMDNAME IS: dpasb001s | | |
| (2) For bitwidth: 16 | | |
| (3) Cell tag is: vcc4dp2 | | |
| (4) Now the pin info | | |
| (5) pin | cap | |
| (6) A | 0.06 | |
| (7) B | 0.07 | |
| (8) INST_CIN | 0.07 | (*Carry Input*) |
| (9) SO | 0.06 | (*Signal Out*) |
| (10) INST_COUT | 0.06 | (*Carry Output*) |
| (11) INST_OVR | 0.06 | (*Overflow Output*) |
| (12) Now the timing info | | |
| (13) from A to SO | | |
| (14) | propRise rampRise propFall rampFall | |
| (15) | 7.9 2.1 7.8 2.1 | |
| (16) from A to INST_COUT | | |
| (17) | propRise rampRise propFall rampFall | |
| (18) | 7.4 4.9 7.3 2.2 | |
| (19) from A to INST_OVR | | |
| (20) | propRise rampRise propFall rampFall | |
| (21) | 6.7 4.9 6.6 2.2 | |
| (22) from B to SO | | |
| (23) | propRise rampRise propFall rampFall | |
| (24) | 7.9 2.1 7.8 2.1 | |
| (25) from B to INST_COUT | | |
| (26) | propRise rampRise propFall rampFall | |
| (27) | 7.4 4.9 7.3 2.2 | |
| (28) from B to INST_OVR | | |
| (29) | propRise rampRise propFall rampFall | |
| (30) | 6.7 4.9 6.6 2.2 | |
| (31) from INS_CIN to SO | | |
| (32) | propRise rampRise propFall rampFall | |
| (33) | 6.2 2.1 6.2 2.1 | |
| (34) from INST_CIN to INS_COUT | | |
| (35) | propRise rampRise propFall rampFall | |
| (36) | 5.7 4.9 5.7 2.2 | |
| (37) from INS_CIN to INST_OVR | | |
| (38) | propRise rampRise propFall rampFall | |
| (39) | 5.2 4.9 5.2 2.2 | |
| (40) height is | 646.4 | |
| (41) width is | 122.2 | |
| (42) power is | 160 | |
| (43) area is | 78,990 | |
| (44) gate equivalents | 208 | |

The first line of code identifies the high-density adder/subtractor by its cell library name "dpasb001s". The second line of code indicates that this particular record is for a 16 bit embodiment of the adder/subtractor. The third line of code identifies the technology fabrication library as "vcc4dp2".

Lines 4–11 of the code define the capacitance values associated with each pin of the adder/subtractor element. Capacitance values are given in pico-Farads. Lines 12–39 define the propagation delays associated with each combination of input and output pins. Delay values are given in nanoseconds. Note that the propagation delay values for this high-speed adder/subtractor are lower than those associated with the element "dpasb001h", but that the power and area values are larger than those associated with the "dpasb001h" adder/subtractor.

An exclusive-OR/NOR operation is also required in the previously described HDL example. The datapath synthesis tool 24 would query the cell library to identify an element or multiple elements to perform this operation. In the vcc4dp2 datapath library, element dpxor0021 is available for this purpose. The following is a pseudocode representation of the internal data structure used to define the local physical information associated with this datapath cell:

| | | | | |
|---|---|---|---|---|
| (1) PMDNAME IS: dpxor0021 | | | | |
| (2) For bitwidth: 16 | | | | |
| (3) Cell tag is: vcc4dp2 | | | | |
| (4) Now the pin info | | | | |
| (5) pin | cap | | | |
| (6) A1 | 0.064 | | | |
| (7) A2 | 0.033 | | | |
| (8) Z | 0.045 | | | |
| (9) ZN | 0.095 | | | |
| (10) Now the timing info | | | | |
| (11) from A1 to Z | | | | |
| (12) | propRise | rampRise | propFall | rampFall |
| (13) | 0.44 | 2.22 | 0.46 | 2.47 |
| (14) from A2 to Z | | | | |
| (15) | propRise | rampRise | propFall | rampFall |
| (16) | 0.75 | 2.22 | 0.71 | 2.47 |
| (17) from A1 to ZN | | | | |
| (18) | propRise | rampRise | propFall | rampFall |
| (19) | 0.2 | 5.93 | 0.23 | 5.32 |
| (20) from A2 to ZN | | | | |
| (21) | propRise | rampRise | propFall | rampFall |
| (22) | 0.49 | 5.85 | 0.57 | 5.45 |
| (23) height is | 646.4 | | | |
| (24) width is | 22.4 | | | |
| (25) power is | 172.64 | | | |
| (26) area is | 14,479 | | | |
| (27) gate equivalents | 64 | | | |

The information provided for the exclusive-OR/NOR element follows the same local information format disclosed in relation to the adder/subtractors.

Returning now to FIG. 3, the final step in the figure is to select cell elements for a given criteria. If the datapath synthesis tool 24 was instructed to implement the previously described HDL behavior to optimize area, then it would rely upon the information available in the physical information database 20 to select the high-density adder/subtractor ("dpasb001 h") over the high-speed adder/subtractor ("dpasb001S"). Note that the HDL behavior may also have been implemented by using an adder, subtractor, and 2-to-1 multiplexer. However, local physical information obtained from the physical information database 20 would indicate that the area factor associated with these three elements would render an area-intensive design.

Figure 4:
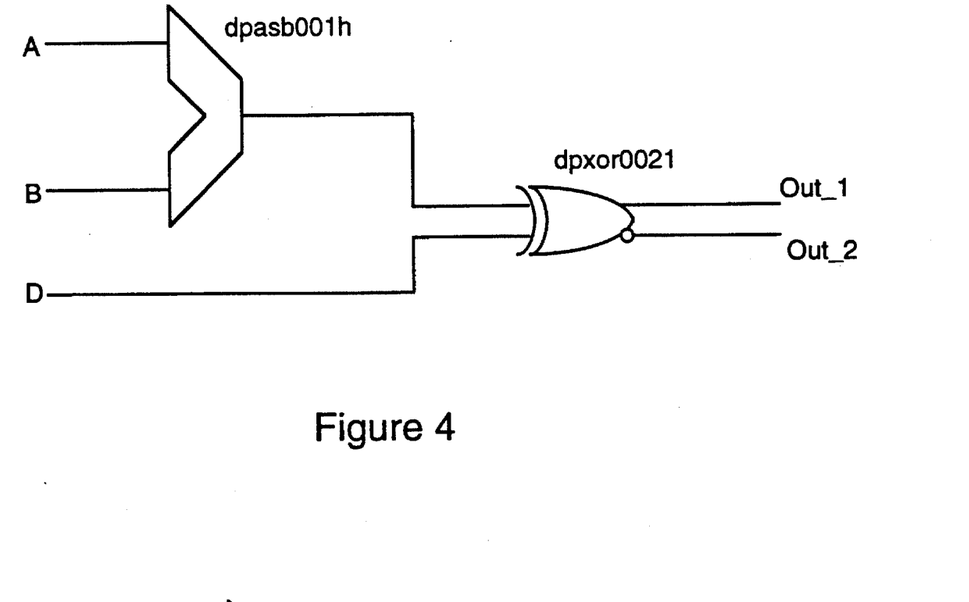
FIG. 4 is an area-optimized circuit synthesized in accordance with the method of the invention.

An area-optimized embodiment of the HDL behavior is provided in FIG. 4. The circuit of FIG. 4 includes the high-density adder/subtractor ("dpasb001h") and the exclusive-OR/NOR gate ("dpxor0021").

Figure 5:
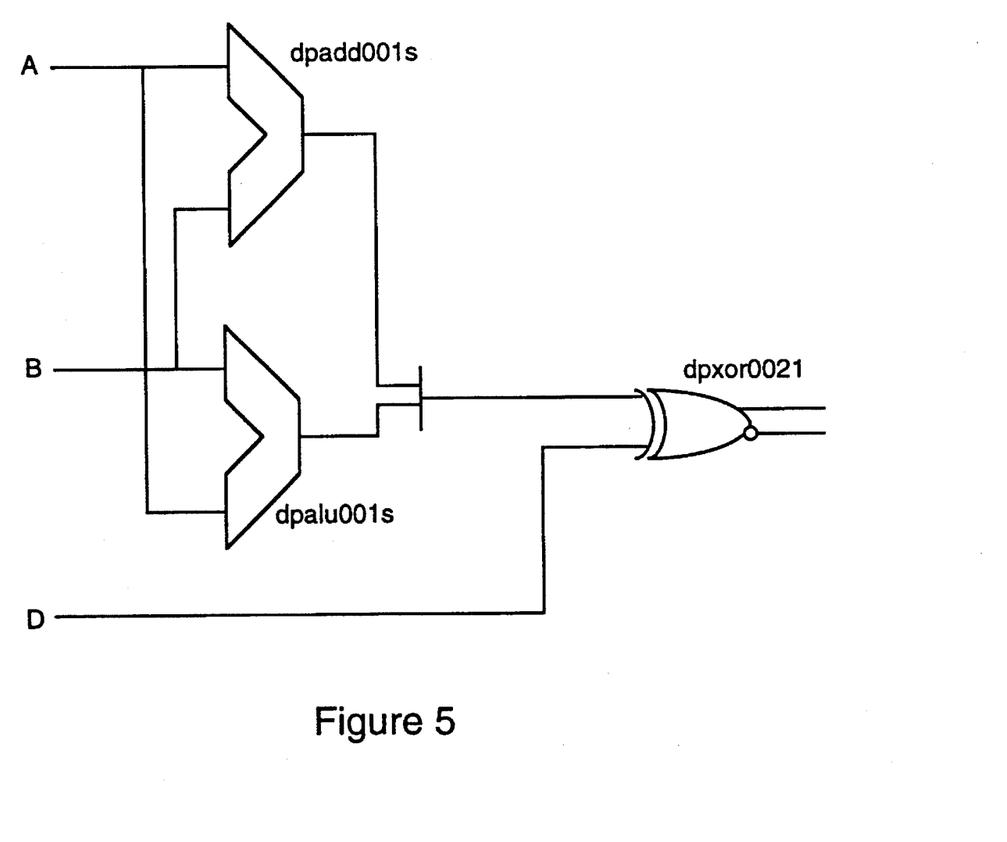
FIG. 5 is a speed-optimized circuit synthesized in accordance with the method of the invention.

A speed-optimized embodiment of the same HDL behavior is provided in FIG. 5. In this case, the datapath synthesis tool 24 would select elements based upon pin-to-pin timing information available in the physical information database 20. FIG. 5 includes an adder (dpadd001s). A pseudocode representation of the internal data structure used to define the local physical information associated with this datapath cell:

| | | |
|---|---|---|
| (1) PMDNAME IS: dpadd001s | | |
| (2) For bitwidth: 16 | | |
| (3) Cell tag is: vcc4dp2 | | |
| (4) Now the pin info | | |
| (5) pin | cap | |
| (6) A | 0.06 | |
| (7) B | 0.06 | |
| (9) INST_CIN | 0.07 | (*Carry Input*) |

-continued

| | | | |
|---|---|---|---|
| (10) SO | 0.06 | (*Signal Out*) | |
| (11) INST_COUT | 0.06 | (*Carry Output*) | |
| (12) INST_OVR | 0.06 | (*Overflow Output*) | |
| (13) Now the timing info | | | |
| (14) from INST_CIN to SO | | | |
| (15) | propRise | rampRise | propFall rampFall |
| (16) | 6.2 | 2.1 | 6.2    2.1 |
| (17) from A to SO | | | |
| (18) | propRise | rampRise | propFall rampFall |
| (19) | 7.9 | 2.1 | 7.8    2.1 |
| (20) from B to SO | | | |
| (21) | propRise | rampRise | propFall rampFall |
| (22) | 7.9 | 2.1 | 7.8    2.1 |
| (23) from INST_CIN to INST_OVR | | | |
| (24) | propRise | rampRise | propFall rampFall |
| (25) | 5.2 | 4.9 | 5.2    2.2 |
| (26) from INST_CIN to INS_COUT | | | |
| (27) | propRise | rampRise | propFall rampFall |
| (28) | 5.7 | 4.9 | 5.7    2.2 |
| (29) from A to INST_COUT | | | |
| (30) | propRise | rampRise | propFall rampFall |
| (31) | 7.4 | 4.9 | 7.3    2.2 |
| (32) from B to INST_COUT | | | |
| (33) | propRise | rampRise | propFall rampFall |
| (34) | 7.4 | 4.9 | 7.3    2.2 |
| (35) from B to INST_OVR | | | |
| (36) | propRise | rampRise | propFall rampFall |
| (37) | 6.7 | 4.9 | 6.6    2.2 |
| (38) height is | 646.4 | | |
| (39) width is | 122.2 | | |
| (40) power is | 160 | | |
| (41) area is | 78,990 | | |
| (42) gate equivalents | 208 | | |

FIG. 5 also includes an Arithmetic Logic Unit (dpalu001s) that has local physical information characteristics as follows:

| | | | |
|---|---|---|---|
| (1) PMDNAME IS: dpalu001s | | | |
| (2) For bitwidth: 16 | | | |
| (3) Cell tag is: vcc4dp2 | | | |
| (4) Now the pin info | | | |
| (5) pin | cap | | |
| (6) A | 0.05 | | |
| (7) B | 0.05 | | |
| (8) INST_CIN | 0.07 | (*Carry Input*) | |
| (9) Inst_0 | 0.03 | (*Control Input*) | |
| (10) Inst_1 | 0.03 | | |
| (11) Inst_2 | 0.03 | | |
| (12) Inst_3 | 0.04 | | |
| (13) Inst_4 | 0.04 | | |
| (14) SO | 0.06 | (*Signal Out*) | |
| (15) INST_COUT | 0.06 | (*Carry Output*) | |
| (16) INST_OVR | 0.06 | (*Overflow Output*) | |
| (17) Now the timing info | | | |
| (18) from Inst_0 to SO | | | |
| (19) | propRise | rampRise | propFall rampFall |
| (20) | 14.102 | 1.6 | 14.202  1.5 |
| (21) from Inst_1 to SO | | | |
| (22) | propRise | rampRise | propFall rampFall |
| (23) | 14.102 | 1.6 | 14.202  1.5 |
| (24) from Inst_2 to SO | | | |
| (25) | propRise | rampRise | propFall rampFall |
| (26) | 8.0 | 1.6 | 8.0    1.5 |
| (27) from Inst_3 to SO | | | |
| (28) | propRise | rampRise | propFall rampFall |
| (29) | 14.102 | 1.6 | 14.202  1.5 |
| (30) from Inst_4 to SO | | | |
| (31) | propRise | rampRise | propFall rampFall |
| (32) | 14.102 | 1.6 | 14.202  1.5 |
| (33) from A to SO | | | |
| (34) | propRise | rampRise | propFall rampFall |
| (35) | 13.302 | 1.6 | 13.432  1.5 |
| (36) from B to SO | | | |
| (37) | propRise | rampRise | propFall rampFall |
| (38) | 13.302 | 1.6 | 13.432  1.5 |
| (39) from INST_CIN to SO | | | |
| (40) | propRise | rampRise | propFall rampFall |
| (41) | 10.002 | 1.6 | 10.102  1.5 |
| (42) from Inst_0 to INST_COUT | | | |
| (43) | propRise | rampRise | propFall rampFall |
| (44) | 14.102 | 1.6 | 14.202  1.5 |
| (45) from Inst_I to INST_COUT | | | |
| (46) | propRise | rampRise | propFall rampFall |
| (47) | 14.102 | 1.6 | 14.202  1.5 |
| (48) from A to INST_COUT | | | |
| (49) | propRise | rampRise | propFall rampFall |
| (50) | 13.302 | 1.6 | 13.432  1.5 |
| (51) from B to INST_COUT | | | |
| (52) | propRise | rampRise | propFall rampFall |
| (53) | 13.302 | 1.6 | 13.432  1.5 |
| (54) from INST_CIN to INST_COUT | | | |
| (55) | propRise | rampRise | propFall rampFall |
| (56) | 10.002 | 1.6 | 14.202  1.5 |
| (57) height is | 646.4 | | |
| (58) width is | 197.6 | | |
| (59) power is | 288 | | |
| (60) area is | 127,729 | | |
| (61) gate equivalents | 368 | | |

The worst-case propagation delay for the adder (dpadd001s) is propRise(7.9)+(rampRise(2.1)*cap_load). The worst-case propagation delay for the ALU (dpalu001s) is propFall(13.432)+(rampFall(1.5)*cap_load). The internal node capacitance load in FIG. 4 is approximately 0.12 picofarads, and the internal node capacitance load in FIG. 5 is approximately 0.2 picofarads. Thus, the worst-case propagation delay in FIG. 5 is about 13.5 nanoseconds. This delay value is lower than the wost-case propagation delay associated with the adder/subtractor (dpasb001h) of FIG. 4, which is propRise(15.15)+(rampRise(1.66)*cap_load), or about 15.4 nanoseconds. On the other hand the cumulative area for the adder and the ALU (206,719 microns$^2$) of FIG. 5 is substantially larger than the area associated with the adder/subtractor (48,803 microns$^2$) of FIG. 4.

Thus, it can now be appreciated how the physical information database 20 of the invention may be used in conjunction with a datapath synthesis tool 24. Attention presently turns to the use of the physical information database 20 in connection with a datapath compilation tool 26.

A high-performance ASIC typically contains a datapath that computes the arithmetic and logic functions of the ASIC. A datapath design is a network of datapath cells, such as multipliers, adders, ALUs, multiplexers and register-files. These cells have regular structures that can be efficiently implemented in bit-slice layouts. The datapath compilation tool maps a parameterized datapath schematic design to a bit-slice layout, standard-cell netlist, or a gate-array netlist.

The bit-slice datapath layout may be divided into two parts: (1) leaf cells that perform the cell functions and (2) optional extra track areas used when enough internal track areas are not available to route all signals. This architecture is exhibited in FIG. 6.

Figure 6:
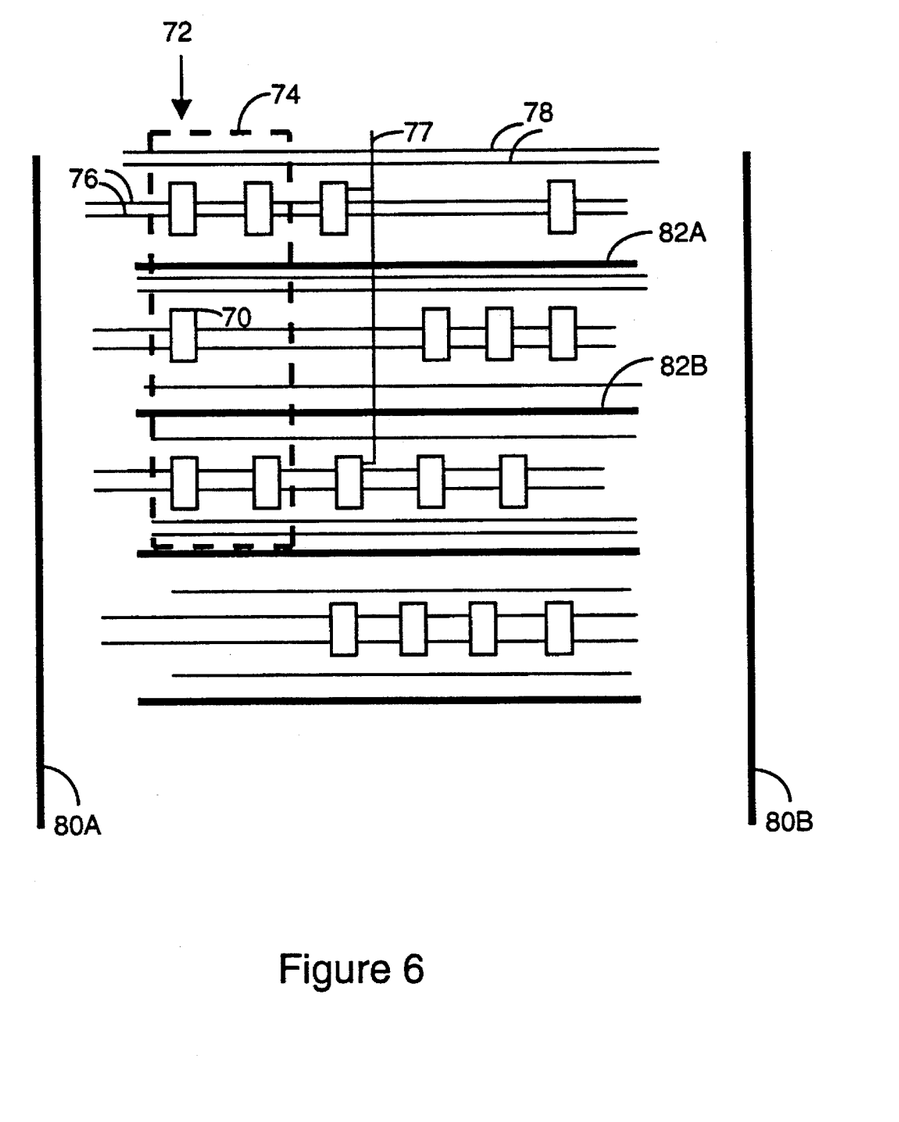
FIG. 6 is a simplified illustration of the physical layout of a compiled datapath circuit.

FIG. 6 depicts a plurality of leaf cells 70 which perform the functional operations within a datapath. A vertical column 72 of leaf cells 70 forms a bit-slice datapath. A grouping of adjacent vertical columns 74 usually forms a datapath element such as an ALU, multiplexer, or adder.

As depicted in FIG. 6, input lines 76 are supplied to each leaf cell 70. In addition, tracks 78 are used to route signals around leaf cells 70. Control lines 77 are used for selected leaf cells in a datapath element 74. The datapath of FIG. 6 also includes vertical power buses 80 and horizontal power buses 82.

In accordance with the invention, the routing capacitances within the datapath are broken up according to (1) the capacitance values for the input lines 76, and (2) the capacitance values for tracks 78. This approach stands in contrast to the prior art approach of relying upon a single average capacitance of a wire over an entire fabrication layer.

In accordance with the invention, this data is provided in the form of global physical information. A pseudo-code format for this information is as follows:

```
(1)  globalPhysicalValues;
(2)  horiz1_cap_of_wire over_cell 0.00011
(3)                     over_extra_tracks 0.00009;
(4)  horiz2_cap_of_wire over_cell 0.00006
(5)                     over_extra_tracks 0.00006;
(6)  vert1_cap_of_wire over_cell 0.00007
(7)                    over_extra_tracks 0.00006;
(8)  calculating_voltage 5.0;
(9)  running_voltage 5.0;
(10) buffer_frequency 40.0;
(11) data_frequency 40.0;
(12) activation_rate 0.15;
(13) endGlobalValues;
```

Lines 2–3 define the capacitance (in picoFarads) for a first horizontal layer of a circuit in terms of cell values and values over extra tracks. Lines 4–5 define the capacitance for a second horizontal layer of a circuit in terms of cell values and values over extra tracks. Data for subsequent layers may be provided if necessary. Lines 6–7 define capacitance values for vertical control lines 77. The more detailed capacitive information available with the present invention may be used in accordance with prior art techniques that back-annotate routing capacitances. Thus, in accordance with the invention, a more accurate total capacitance value may be obtained for a routed signal.

The global physical information also includes a calculating voltage parameter (in volts) that corresponds to the default voltage value used in the mathematical model of the circuit generated by the datapath compilation tool 26. The running voltage defined at line 9 corresponds to the voltage at which the circuit will actually operate. The buffer frequency defined at line 10 is the clock frequency given in megahertz. The data frequency defined at line 11 is also given in megahertz. The final parameter at line 12 is the activation rate which describes the average percentage of transistors changing states at each clock cycle.

The global physical parameters may be used by the datapath compilation tool to establish a number of design features for a circuit. Specifically, the physical information database may be used to perform resource allocation tasks in a reasonable time without using excessive computing power.

A significant factor that is calculated by using the global physical parameters is the total current through a datapath core. The total current value is subsequently used to calculate the size of power rails for the circuit. The total datapath core current may be defined as follows:

$$(Total\_Element\_Power * data\_Frequency * activation\_rate * running\_voltage) / calculating\_voltage^2$$

The total element power value is obtained by summing the power values associated with each cell in the circuit. Thus, the "power" field for the local physical information data of the physical information database 20 may be used to provide the power values for each cell in the circuit. The remaining values are obtained from the global physical information data.

The total core current value may be used to define power bus values. The value for each vertical power bus (80A, 80B) may be defined as follows:

$$total\_current / (2.0 * current\_density\_of\_bus\_metal)$$

The current density of the bus metal is unique to the fabrication process selected. The value for each horizontal power bus (82A, 82B) may be defined as follows:

$$(total\_current / Num\_buses) / (2.0 * current\_density\_of\_bus\_metal)$$

Thus, it will be appreciated that the global physical values available in the physical information database 20 of the invention may be used by the datapath compilation tool 26 to select design values for a circuit. In particular, by providing more accurate capacitance information, the total capacitance for a routed signal may be computed more accurately. In addition, a more accurate total current value for the logic core may be obtained. The total current value may then be used to determine power rail sizes.

One skilled in the art will appreciate that the physical information database 20 of the invention may also be used to enhance the performance of other electronic design automation tools, such as HDL generation tools 28 and chip estimation tools 30. An HDL generation tool 28, also called a schematic capture device, takes a datapath schematic netlist and converts it to an HDL description of the datapath. In the prior art, the HDL description generated by an HDL generation tool 28 does not have timing information. However, in accordance with the invention, the physical information database 20 may be used to obtain timing information. In particular, the timing parameters for the individual cells within the HDL description may be provided in the form of a timing report. For example, the area optimized circuit of FIG. 4 may have a timing report as follows:

```
(1) Element:      dpasb001h
(2) W_C_P_D:     propRise + (rampRise * cap_load)
                  = 12.96 + (1.66 * cap_load) = W_C_P_D_1
(3) Element:      dpxor0021
(4) W_C_P_D:     propRise + (rampRise * cap_load)
                  0.75 + (2.22 * cap_load) = W_C_P_D_2
(5) Total Estimated Propagation Delay:
                                  W_C_P_D_1 + W_C_P_D_2
```

Line 1 defines the adder/subtractor of FIG. 4. Line 2 defines the worst case propagation delay for that element. This information is obtained from lines 26–28 of the local physical information associated with this element, as given above. Line 3 defines the exclusive-OR/NOR element of FIG. 4. Line 4 gives the worst case propagation delay information. The local physical information associated with this element, provided above, indicates that the connection between A2 and Z has a propagation rise time of 0.75 plus 2.22 times the capacitance load on the Z output pin.

Line 5 of the report provides a total propagation delay factor. Naturally, the form of an actual report will be much more comprehensive. For instance, it would preferably include propagation delays for connectors. The report could also rely upon average propagation delays, instead of worst case propagation delays.

Thus, an HDL generation tool 28 used in conjunction with the physical information database 20 of the invention may be used to provide timing information associated with a given circuit schematic.

The physical information database 20 of the invention may also be used in connection with a chip estimation tool 30. A chip estimation tool 30 is used as a quick estimate tool to obtain information on a proposed design. Typical inquiries to a chip estimation tool 30 would relate to the number of gates, the power consumed, and the total area of a proposed design. In view of the format previously provided for the local physical information, it is readily appreciated how the physical information database may be successfully used with a chip estimation tool. The local physical information for each datapath library cell includes information regarding the number of gates in the cell, the power consumed by the cell, and the area occupied by the cell. These factors may be summed for all cells in a design to provide accurate cumulative physical information regarding a circuit design. Unlike prior art chip estimation tools that have embedded system information, the present invention allows a chip estimation tool to access a separate physical information data base.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

In the claims:

1. An electronic design automation apparatus, comprising:

a datapath cell library including a plurality of circuit elements that may be selected to implement a circuit specification corresponding to a desired functional operation;

a plurality of electronic design automation tools for processing said circuit specification including at least one synthesis tool and at least one analysis tool; and a shared physical information database, accessible by said plurality of electronic design automation tools, including physical information data corresponding to said plurality of circuit elements, said plurality of electronic design automation tools using said physical information data of said physical information database for analysis of said circuit specification, said analysis utilizing information in said shared physical information database that is accessed by at least one synthesis tool and at least one analysis tool.

2. The electronic design automation apparatus of claim 1 wherein said synthesis tool is selected from the group including a datapath synthesis tool and an HDL generation tool.

3. The electronic design automation apparatus of claim 2 wherein said datapath synthesis tool accesses said physical information data of said physical information database to select, based upon a predetermined criteria, a single cell element from a plurality of elements.

4. The electronic design automation apparatus of claim 2 wherein said HDL generation tool accesses said physical information data of said physical information database to generate a timing report.

5. The electronic design automation apparatus of claim 1 wherein said analysis tool is selected from the group including a datapath compilation tool and a chip estimation tool.

6. The electronic design automation apparatus of claim 5 wherein said datapath compilation tool accesses said physical information data of said physical information database to calculate the total current through a datapath core.

7. The electronic design automation apparatus of claim 5 wherein said datapath compilation tool accesses said physical information data of said physical information database to define power bus values.

8. The electronic design automation apparatus of claim 1 wherein said physical information database includes:

global physical information defining physical attributes applicable to each of said plurality of circuit elements of said datapath cell library; and local physical information defining physical attributes associated with individual circuit elements of said plurality of circuit elements of said datapath cell library.

9. The electronic design automation apparatus of claim 8 wherein said global physical information includes capacitance data, voltage data, and frequency data.

10. The electronic design automation apparatus of claim 8 wherein said local physical information includes a cell name, a fabrication library, pin information, timing information, size attributes, and power attributes.

11. A method of analyzing a circuit specification corresponding to a desired functional operation, said method comprising the steps of:

providing a datapath cell library including a plurality of circuit elements that may be selected to implement said desired functional operation;

operating a plurality of electronic design automation tools, including at least one synthesis tool and at least one analysis tool, to process said circuit specification;

constructing a shared physical information database with information corresponding to said plurality of circuit elements; and using said plurality of electronic design automation tools to analyze said circuit specification, wherein at least one synthesis tool and at least one analysis tool access common information in said shared physical information database.

12. The method of claim 11 wherein said operating step includes the step of operating a datapath synthesis tool and an HDL generation tool.

13. The method of claim 12 wherein said using step includes the step of using said datapath synthesis tool to access said physical information data of said physical information database to select, based upon a predetermined criteria, a single cell element from a plurality of elements.

14. The method of claim 12 wherein said using step includes the step of using said HDL generation tool to access said physical information data of said physical information database to generate a timing report.

15. The method of claim 11 wherein said operating step includes the step of operating a datapath compilation tool and a chip estimation tool.

16. The method of claim 15 wherein said using step includes the step of using said datapath compilation tool to access said physical information data of said physical information database to calculate the total current through a datapath core.

17. The method of claim 15 wherein said using step includes the step of using said datapath compilation tool to access said physical information data of said physical information database to define power bus values.

18. The method of claim 11 wherein said constructing step includes the step of constructing a physical information database including:
  global physical information defining physical attributes applicable to each of said plurality of circuit elements of said datapath cell library; and
  local physical information defining physical attributes associated with individual circuit elements of said plurality of circuit elements of said datapath cell library.

19. The method of claim 18 wherein said constructing step includes the step of constructing global physical information including capacitance data, voltage data, and frequency data.

20. The method of claim 18 wherein said constructing step includes the step of constructing local physical information including a cell name, a fabrication library, pin information, timing information, size attributes, and power attributes.

* * * * *